(12) United States Patent
Kogo et al.

(10) Patent No.: US 10,709,013 B2
(45) Date of Patent: Jul. 7, 2020

(54) MULTILAYER WIRING BOARD AND DIFFERENTIAL TRANSMISSION MODULE

(71) Applicant: Hitachi Metals, Ltd., Minato-ku, Tokyo (JP)

(72) Inventors: Kenji Kogo, Tokyo (JP); Kei Nishimura, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 15/904,904

(22) Filed: Feb. 26, 2018

(65) Prior Publication Data

US 2018/0279465 A1 Sep. 27, 2018

(30) Foreign Application Priority Data

Mar. 22, 2017 (JP) ................. 2017-055425

(51) Int. Cl.
*H01P 3/02* (2006.01)
*H05K 1/02* (2006.01)
*H05K 1/18* (2006.01)
*H05K 1/11* (2006.01)
*H01P 3/08* (2006.01)
*H01P 5/02* (2006.01)
*H03H 7/38* (2006.01)
*H04L 25/03* (2006.01)

(52) U.S. Cl.
CPC ............ *H05K 1/0245* (2013.01); *H01P 3/02* (2013.01); *H01P 3/026* (2013.01); *H01P 3/08* (2013.01); *H01P 5/022* (2013.01); *H03H 7/38* (2013.01); *H05K 1/115* (2013.01); *H05K 1/181* (2013.01); *H04L 25/03878* (2013.01); *H05K 2201/10189* (2013.01); *H05K 2201/10356* (2013.01)

(58) Field of Classification Search
CPC ........... H03H 7/38; H05K 1/0245; H01P 3/02
USPC ......... 333/33, 246, 238, 28 R; 174/252, 260, 174/262, 266
See application file for complete search history.

(56) References Cited

U.S. PATENT DOCUMENTS 8,552,308 B2 * 10/2013 Lee ...................... H05K 1/0245
174/255
8,835,775 B2 * 9/2014 Fan ...................... H05K 1/0245
174/250
9,929,712 B2 * 3/2018 Fukuchi ................ H03H 7/427
(Continued)

FOREIGN PATENT DOCUMENTS

JP 2001-332858 11/2001

*Primary Examiner* — Stephen E. Jones
(74) *Attorney, Agent, or Firm* — Crowell & Moring LLP

(57) ABSTRACT

A multilayer wiring board having a first layer and a second layer laminated with a ground conductor, respectively, and having a differential wire line configured with a first wire line and a second wire line, includes a pair of through-holes and which is formed in the first layer and the second layer and electrically connects the first wire line and the second wire line arranged on one surface of the multilayer wiring board and the first wire line and the second wire line arranged on the other surface of the multilayer wiring board, respectively; and clearances and which insulate the ground conductor and the through-holes and, in which the pair of through-holes formed in the second layer is arranged so that a virtual line connecting centers of the pair of through-holes is inclined with respect to a line perpendicular to a signal propagation direction of the differential wire line.

6 Claims, 13 Drawing Sheets

(56) References Cited

U.S. PATENT DOCUMENTS

| | | | | |
|---|---|---|---|---|
| 2004/0189418 A1* | 9/2004 | Bartley | ............... | H01P 3/08 |
| | | | | 333/4 |
| 2006/0166525 A1* | 7/2006 | Yamakami | ......... | G01R 31/021 |
| | | | | 439/67 |
| 2009/0152689 A1* | 6/2009 | Nease | ............... | H01L 23/66 |
| | | | | 257/664 |

* cited by examiner

SIGNAL PROPAGATION DIRECTION →

CROSS SECTION TAKEN ALONG LINE A-A

SIGNAL PROPAGATION DIRECTION →

SIGNAL PROPAGATION DIRECTION →

F I G. 1 1
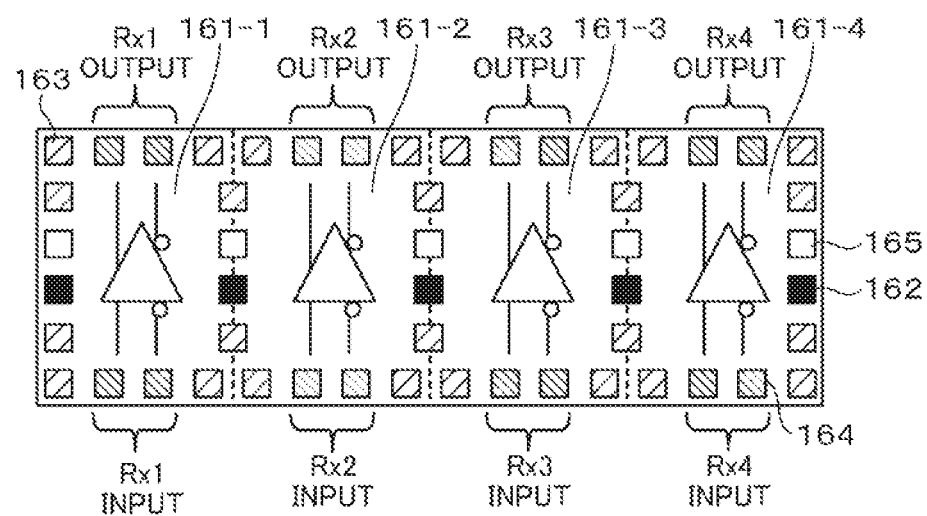
F I G. 1 2
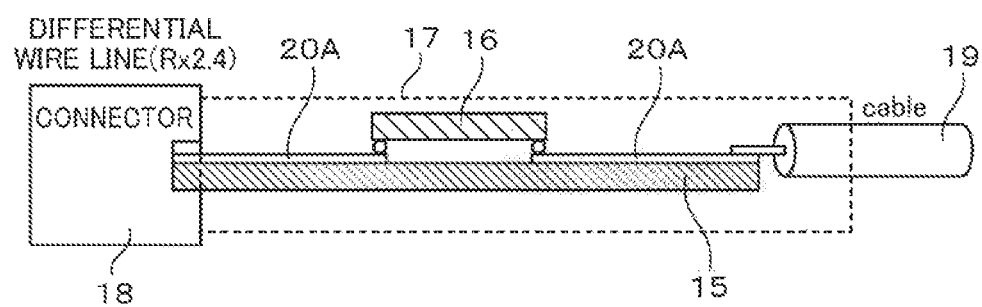

SIGNAL PROPAGATION DIRECTION →

SIGNAL PROPAGATION DIRECTION →

SIGNAL PROPAGATION DIRECTION

MULTILAYER WIRING BOARD AND DIFFERENTIAL TRANSMISSION MODULE

TECHNICAL FIELD

The present invention relates to a multilayer wiring board and a differential transmission module.

BACKGROUND ART

With a great increase in the amount of data to be processed in the information telecommunication field, there is a demand for an increase in signal transmission speed within a device and between devices. In recent years, in order to cope with such high-speed transmission, a differential transmission system has been used.

For example, a system using a cable with a connector such as a quad small form-factor pluggable (QSFP) is adopted for transmission within the device and between devices, and for example, a direct attach cable (DAC) is frequently used. However, since the transmission distance of the DAC is limited to about 3 m, a longer transmission distance is required. In addition, for example, in such high-speed transmission exceeding 25 Gbit/s, loss in a transmission line becomes a problem. For this reason, application of an active copper cable (ACC) in which an equalization element for compensating for loss occurring in a transmission line is mounted in a connector such as QSFP as a transmission cable which replaces the DAC has been studied. As a board of the connector used for this cable, a multilayer board where two or more types of resin boards having different thicknesses are laminated is frequently used.

The equalization element of the ACC is mounted on one side of the multilayer board in consideration of assembly cost and reliability after mounting the element. On the other hand, in general, signal input/output pins of the connector are provided on both front and back surfaces of the multilayer board from the viewpoint of high density. Therefore, in the multilayer board for the connector of the ACC, for example, it is required that a pin on the surface on which an equalization element is not mounted can be electrically connected to the equalization element by providing a through-hole. For example, Patent Document 1 discloses a configuration example where a land of a first wire line layer and a land of an n-th wire line layer are connected by a via-hole provided inside a multilayer printed wiring board.

CITATION LIST

Patent Document

Patent Document 1: JP 2001-332858 A

SUMMARY OF THE INVENTION

Problems to be Solved by the Invention

The above-mentioned ACC is required to have compatibility with the DAC. Therefore, the outer size and the pin arrangement of the connector of the ACC are designed in accordance with the DAC standard, and the outer size of the multilayer board of the connector is also designed in accordance with the DAC standard. In a case where a connector is manufactured by arranging a plurality of wire lines for differential transmission and equalization elements in parallel within such a restricted board width, good high-speed signal transmission characteristics may not be obtained in the ACC. No knowledge on this point is disclosed in Patent Document 1.

In this regard, an object of the present invention is to provide a multilayer wiring board capable of obtaining good high-speed signal transmission characteristics by differential transmission and a differential transmission module using the multilayer wiring board.

Solutions to Problems

According to an aspect of the present invention, there is provided a multilayer wiring board having a first layer and a second layer thicker than the first layer laminated with a ground conductor, respectively, and having a differential wire line configured with a first wire line and a second wire line, including: a pair of through-holes which is formed in the first layer and the second layer and electrically connects the first wire line and the second wire line arranged on one surface of the multilayer wiring board and the first wire line and the second wire line arranged on the other surface of the multilayer wiring board, respectively; and a clearance which insulates the ground conductor and the through-holes, in which the pair of through-holes formed in the second layer is arranged so that a virtual line connecting centers of the pair of through-holes is inclined with respect to a line perpendicular to a signal propagation direction of the differential wire line.

In addition, according to another aspect of the present invention, there is provided a differential transmission module including: a multilayer wiring board having a first layer and a second layer thicker than the first layer laminated with a ground conductor, respectively, and having a differential wire line configured with a first wire line and a second wire line; and an equalization element mounted on the differential wire line of the multilayer wiring board and having a circuit compensating for loss occurring in the differential wire line, in which the multilayer wiring board includes: a pair of through-holes which is formed in the first layer and the second layer and electrically connects the first wire line and the second wire line arranged on one surface of the multilayer wiring board and the first wire line and the second wire line arranged on the other surface of the multilayer wiring board, respectively; and a clearance which insulates the ground conductor and the through-holes, and in which the pair of through-holes formed in the second layer is arranged so that a virtual line connecting centers of the pair of through-holes is inclined with respect to a line perpendicular to a signal propagation direction of the differential wire line.

Effects of the Invention

According to the present invention, it is possible to realize a multilayer wiring board capable of obtaining good high-speed signal transmission characteristics by differential transmission and a differential transmission module using the multilayer wiring board.

BRIEF DESCRIPTION OF THE DRAWINGS

FIG. 11 is a diagram illustrating an overview of a chip of an equalization element 16 illustrated in FIG. 9.

FIG. 12 is a diagram illustrating a wire line structure of a differential wire line having pins (Rx2 and Rx4) on a front surface side in the ACC module illustrated in FIG. 9.

MODE FOR CARRYING OUT THE INVENTION

Embodiment

Before describing a multilayer wiring board according to an embodiment, problems of a multilayer wiring board of the related art applied to an ACC connector for differential transmission will be described below. As a paddle board of a connector, a multilayer wiring board where two or more types of layers having different layer thicknesses are laminated is frequently used. In such a multilayer wiring board, in general, since the diameter of a through-hole is formed to be small in a layer with a small layer thickness, the spacing of a through-hole pair corresponding to a wire line pair of differential wire lines (hereinafter, simply referred to as a differential pair of through-holes) becomes a narrow pitch. On the other hand, since the diameter of a through-hole is generally large in a layer having a large layer thickness, the spacing of a differential pair of the through-holes becomes a wide pitch.

As a result of studies made by the inventors on the problem of the case of adopting such a multilayer wiring board to a paddle board of a connector, in a layer where the differential pair of through-holes has a wide-pitch, when a virtual line connecting the through-holes of the pair crosses the line in the signal propagation direction perpendicularly, it is found that the high-speed signal transmission characteristics are likely to be hindered.

Figure 20:
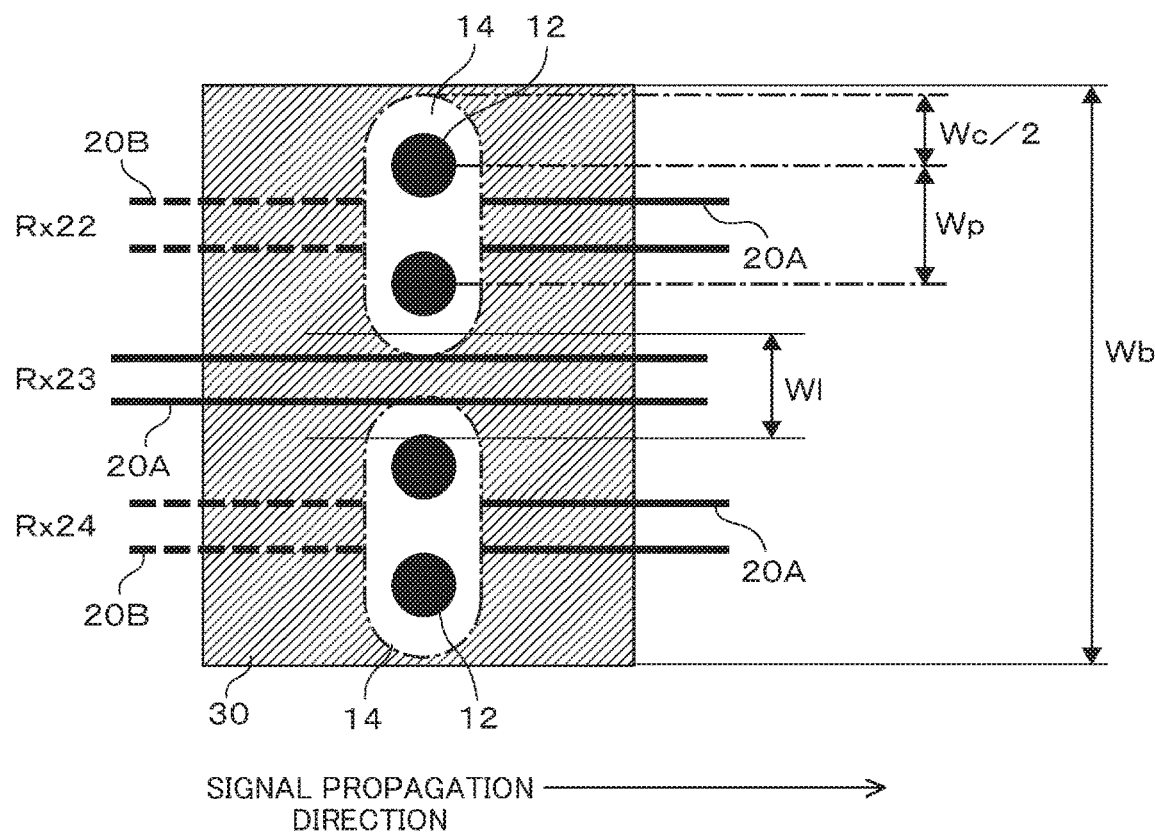
FIG. 20 is a diagram illustrating a configuration of a multilayer wiring board of the related art.

This point will be described in detail with reference to FIG. 20. FIG. 20 is a diagram illustrating a configuration of a multilayer wiring board of the related art. In FIG. 20, for the convenience of description, a wide-pitch through-hole pair 12 and clearances 14 are illustrated. In practice, a layer in which narrow-pitch through-holes are formed is laminated on the upper surface and the lower surface of a layer in which the wide-pitch through-holes 12 are formed as illustrated in FIG. 20. However, in FIG. 20, the through-holes and the clearances of these layers are omitted.

In FIG. 20, a GND pattern 30 is formed in each layer of the multilayer wiring board. Among the differential wire lines Rx22, Rx23, and Rx24 for high-speed signals, the Rx23 is configured only with front surface wire lines 20A wired on the front surface of the multilayer wiring board. On the other hand, with respect to the Rx22 and the Rx24, the back surface wire line 20B wired on the back surface of the multilayer wiring board and the front surface wire line 20A are connected through the through-holes 12 having the clearances 14 formed by hollowing out the GND pattern 30. FIG. 20 illustrates an example in which the Rx23 is wired so as to pass through a region between the through-hole 12 of Rx22 and the through-hole 12 of Rx24 on the front surface of the multilayer wiring board.

In this configuration, in FIG. 20, a wire line width on the board side is denoted by "Wb", a spacing of the differential pair of the wide-pitch through-holes 12 is denoted by "Wp", a width obtained by subtracting "Wp" from the width of the clearance 14 of the through-hole 12 is denoted by "Wc", and a width of the GND pattern corresponding to the wire line width of the differential wire line Rx23 is denoted by "Wl", In this case, when "A" represented by the following expression (1) has a negative value, the GND pattern which is a return path of the Rx23 becomes narrow, and reflection is caused by impedance discontinuity, so that good high-speed signal transmission characteristics cannot be obtained.

$$A = Wb - (2 \times Wl + 2 \times (Wp + Wc)) \quad (1)$$

In addition, for example, in a case where the length of the QSFP board in the length direction (the direction perpendicular to the "Wb" direction) is made longer so that the positions of the through-holes in the width direction do not overlap with each other, the length of the wire lines of the paddle board becomes longer, which leads to loss deterioration, so that the performance of the device is degraded. Therefore, in order to shorten the paddle board, as illustrated in first to third embodiments described later, it is preferable that the through-holes are arranged at positions overlapping in the width direction.

First Embodiment

Figure 1:
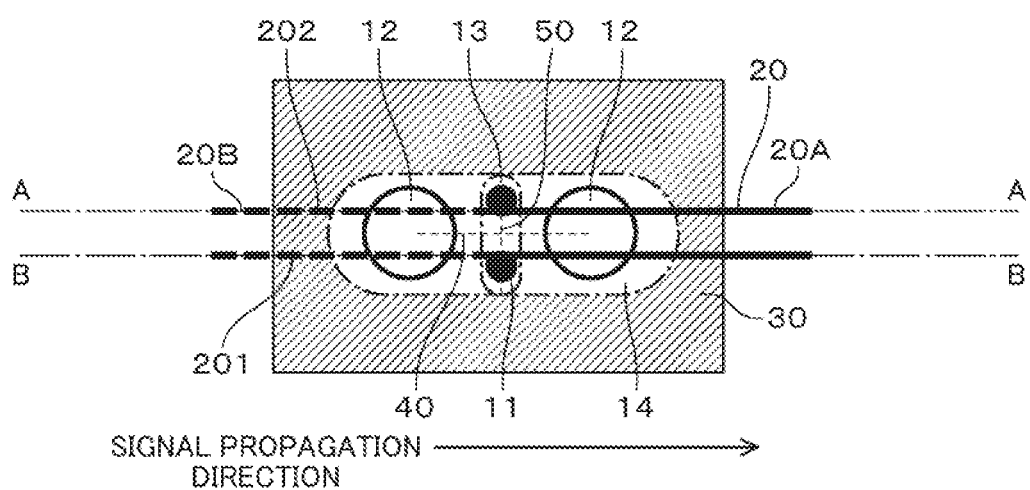
FIG. 1 is a top view illustrating a through-hole structure of a multilayer wiring board according to a first embodiment.
Figure 2:
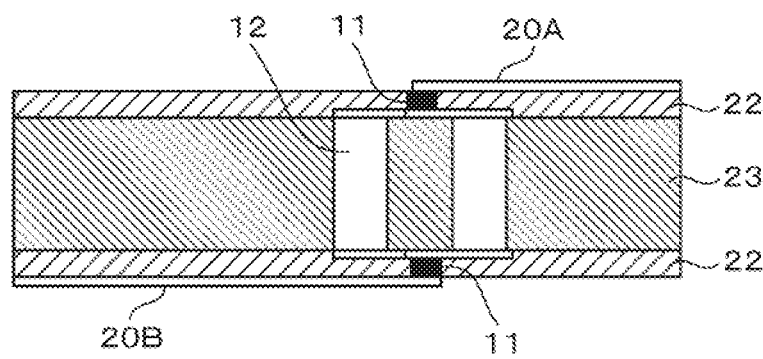
FIG. 2 is a cross-sectional view taken along line A-A of FIG. 1.
Figure 3:
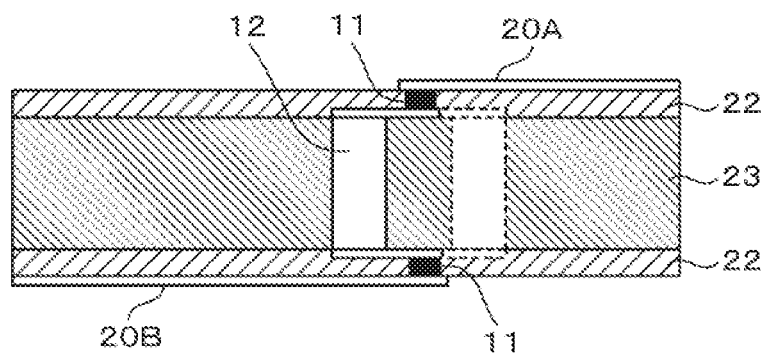
FIG. 3 is a cross-sectional view taken along line B-B of FIG. 1.
Figure 4:
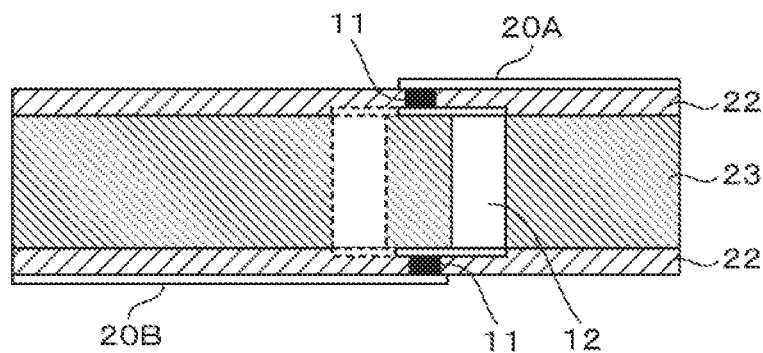
FIG. 4 is a cross-sectional view taken along line A-A of FIG. 1.
Figure 5:
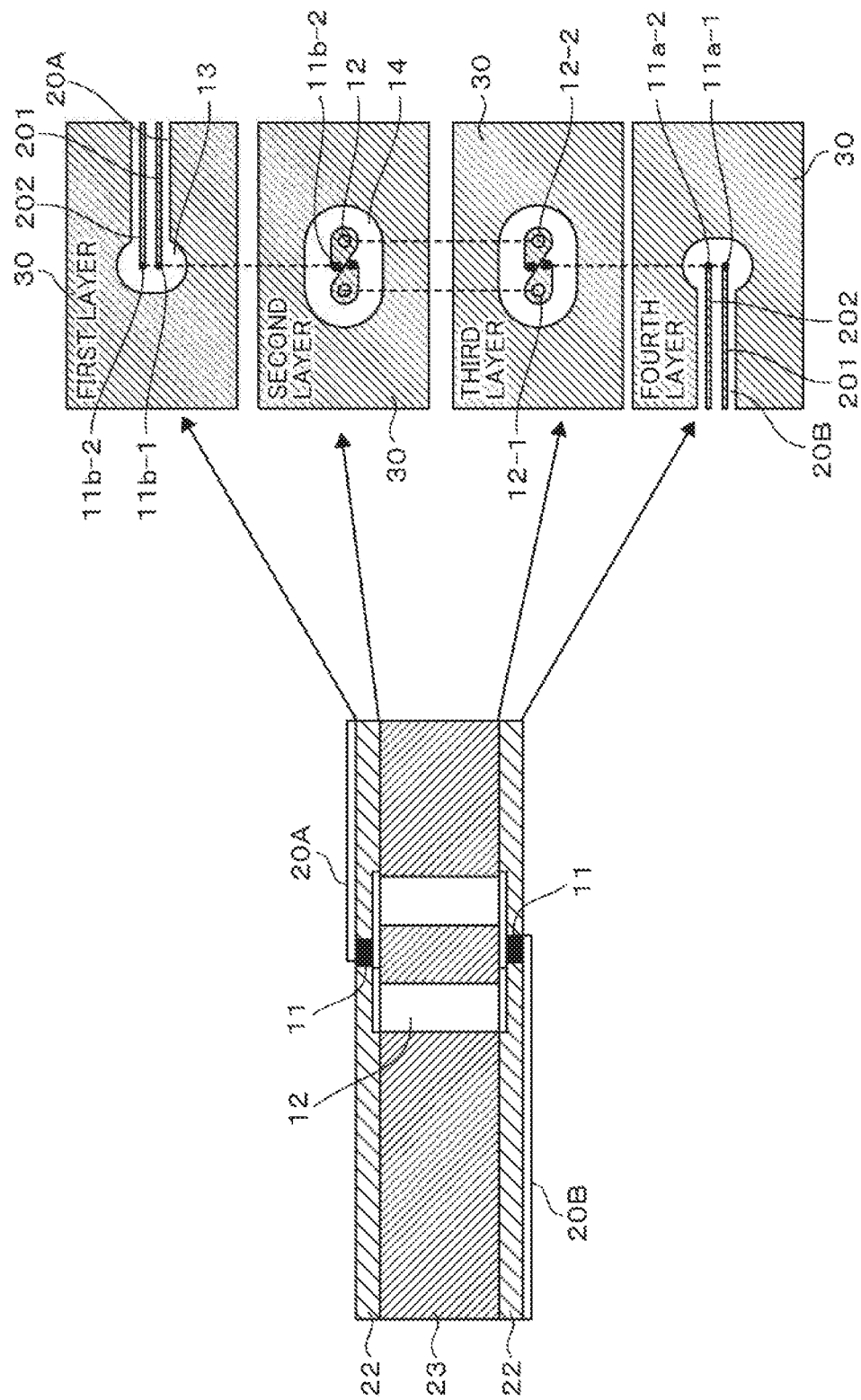
FIG. 5 is a diagram illustrating a wiring pattern of each layer of the multilayer wiring board illustrated in FIG. 1.

Hereinafter, a configuration of a multilayer wiring board according to a first embodiment will be described with reference to FIGS. 1 to 5. FIG. 1 is a top view illustrating a through-hole structure of the multilayer wiring board according to the first embodiment. FIGS. 2 and 4 are cross-sectional views taken along line A-A of FIG. 1, and FIG. 3 is a cross-sectional view taken along line B-B of FIG. 1. FIG. 5 is a diagram illustrating a wiring pattern of each layer of the multilayer wiring board illustrated in FIG. 1.

The multilayer wiring board illustrated in FIGS. 1 to 5 is assumed to be used for a paddle board of a connector related to high-speed wired transmission. As the multilayer wiring board for the paddle board, a resin board laminated with resin layers having different layer thicknesses can be appropriately used. As a result, it is possible to achieve both high density wire line and improved board strength without using high cost materials such as ceramics.

As illustrated in FIG. 2, the multilayer wiring board is configured by alternately laminating a build-up layer 22 (first layer) having a small layer thickness and a core layer 23 (second layer) having a large layer thickness.

As illustrated in FIG. 1, the multilayer wiring board is wired with a differential wire line 20 having an N wire line 201 which is a first wire line and a P wire line 202 which is a second wire line as a set of transmission lines. Each of the P wire line 202 and the N wire line 201 has a back surface wire line 20B wired on the back surface of the multilayer wiring board and a front surface wire line 20A wired on the front surface of the multilayer wiring board.

The front surface wire line 20A and the back surface wire line 20B are electrically connected to each other by a through-hole 11 formed in the build-up layer 22 and a through-hole 12 formed, in the core layer 23. Each of the through-holes 11 and 12 is configured by a differential pair having a through-hole connecting the P wire line 202 and a through-hole connecting the N wire line 201 as a pair. Since the build-up layer 22 can be micro-fabricated and has a small through-hole diameter, the differential pair of the through-hole 11 is formed with a narrow pitch (refer to FIG. 1). On the other hand, with respect to the core layer 23, although a high board strength can be obtained, it is difficult to perform micro-fabrication, and the through-hole diameter is large, so that the differential pair of the through-hole 12 is formed with a wide pitch (refer to FIGS. 1 and 2).

As illustrated in FIG. 5, the multilayer wiring board includes wire line layers of the first layer to the fourth layer formed by the build-up layer 22 and the core layer 23.

The first layer is a layer having the front surface wire line 20A of the differential wire line 20 and is a wiring pattern layer on the upper surface of the build-up layer 22. The second layer is a wiring pattern layer on the upper surface of the core layer 23, and the third layer is a wiring pattern layer on the lower surface of the core layer 23. The second layer which is the wiring pattern layer of the upper surface of the core layer 23 and the third layer which is the wiring pattern layer of the lower surface of the core layer 23 have the same wiring pattern. The fourth layer is a layer having the back surface wire line 20B of the differential wire line 20 and is a wiring pattern layer on the lower surface of the build-up layer 22.

In addition, in the through-hole structure, in each layer, if the wiring pattern of the P wire line 202 and the N wire line 201 is symmetrical and the wiring states of the P wire line 202 and the N wire line 201 are uniformly aligned, the wiring angle may also be changed.

A ground conductor pattern 30 (hereinafter, simply referred to as a GND pattern 30) is formed in each of the first layer to the fourth layer. The clearance 13 for preventing short-circuit between the through-hole 11 and the GND pattern 30 and the clearance 14 for preventing short-circuit between the through-hole 12 and the GND pattern 30 are formed around the through-holes 11 and 12 of each layer by hollowing out the GND pattern 30.

As illustrated in FIG. 1, the differential pair of the through-holes 12 of the core layer 23 is arranged so that a virtual line 40 connecting the centers thereof is inclined with respect to a line which is perpendicular to the signal propagation direction of the differential wire line and horizontal to the main surface of the multilayer wiring board. That is, the through-holes 12 of the core layer 23 are arranged so that the virtual line 40 connecting the centers of the differential pair does not coincide with the line perpendicular to the signal propagation direction. Hereinafter, "perpendicular to the signal propagation direction of the differential wire line" denotes that the line is perpendicular to the signal propagation direction of the differential wire line and horizontal to the main surface of the multilayer wiring board.

In the example illustrated in FIG. 1, the through-hole 12 of the core layer 23 is arranged so that a virtual line 40 connecting the centers of the differential pair is parallel to the signal propagation direction. In this manner, the through-holes 12 of the core layer 23 where the spacing of the differential pair becomes a wide pitch are arranged in parallel to the signal propagation direction, so that the clearance 14 of the core layer 23 is arranged so as not to spread in a direction where the width of the multilayer wiring board is restricted, that is, in a direction perpendicular to the signal propagation direction. Therefore, the formation width of the clearance 14 of the core layer 23 is allowed to be narrowest with respect to the direction where the width of the multilayer wiring board is restricted.

On the other hand, in the example illustrated in FIG. 1, the differential pair of the through-hole 11 of the build-up layer 22 is arranged so that a virtual line 50 connecting the centers of the differential pair is perpendicular to the signal propagation direction.

The flow of signal transmission in the multilayer wiring board according to the first embodiment described above will be described with reference to FIG. 5 by taking the N wire line 201 as an example. The signal transmitted by the back surface wire line 20B of the N wire line 201 is connected to the core layer 23 through the through-hole 11a-1 of the through-hole pair 11 of the build-up layer 22 in which the virtual line connecting the differential pair is arranged perpendicular to the signal propagation direction (fourth layer to third layer).

The signal connected to the core layer 23 passes through the core layer 23 and is connected to the build-up layer 22 of the upper layer through the through-hole 12-1 of the through-hole pair 12 of the core layer 23 in which the virtual line connecting the differential pair is arranged parallel to the signal propagation direction (third layer to second layer).

The signal connected to the build-up layer 22 of the upper layer is transmitted to the front surface wire line 20A of the N wire line 201 through the through-hole 11b-1 of the through-hole pair 12 of the build-up layer 22 in which the virtual line connecting the differential pair is arranged perpendicular to the signal propagation direction (second layer to first layer).

FIG. 3 illustrates the transmission path of the N wire line 201, and FIG. 4 illustrates the transmission path of the P wire line 202. In FIGS. 3 and 4, the through-holes not used in each transmission path are indicated by broken lines.

Figure 14:
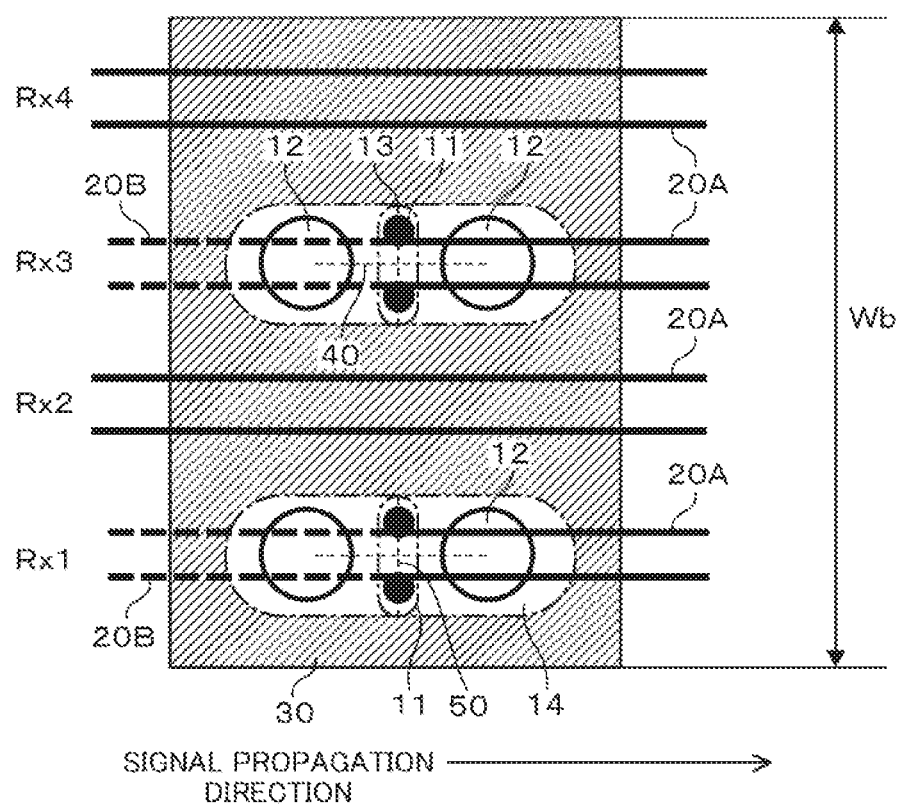
FIG. 14 is a top view of a multilayer wiring board to which the through-hole structure illustrated in FIG. 1 is applied.

FIG. 14 illustrates a top view of a multilayer wiring board to which the through-hole structure illustrated in FIG. 1 is applied. The differential wire line Rx2 configured only with the front surface wire line 20A is wired in the region between the differential wire lines Rx1 and Rx3 having the back surface wire line 20B and the front surface wire line 20A. In addition, a differential wire line Rx4 including only the front surface wire line 20A is wired in a region closer to the board end than the differential wire line Rx3.

According to the configuration of the first embodiment, the through-hole 12 of the core layer 23 is formed so that the clearance width of the core layer 23 in the direction perpendicular to the signal propagation direction (the direction where the width of the multilayer wiring board is restricted) is shortened. Therefore, in the core layer 23, the width of the GND pattern of Rx2 is secured, and good high-speed signal transmission characteristics can be obtained.

Second Embodiment

Figure 6A:
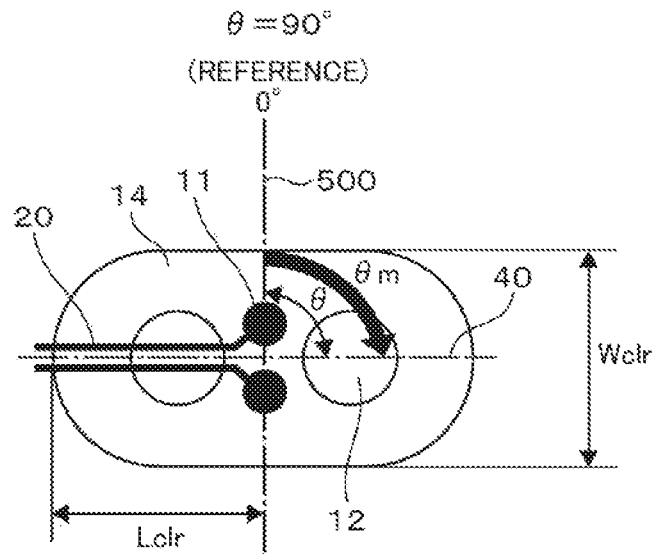
FIG. 6A is a diagram illustrating through-holes and clearances formed in the multilayer wiring board according to the first embodiment.
Figure 6B:
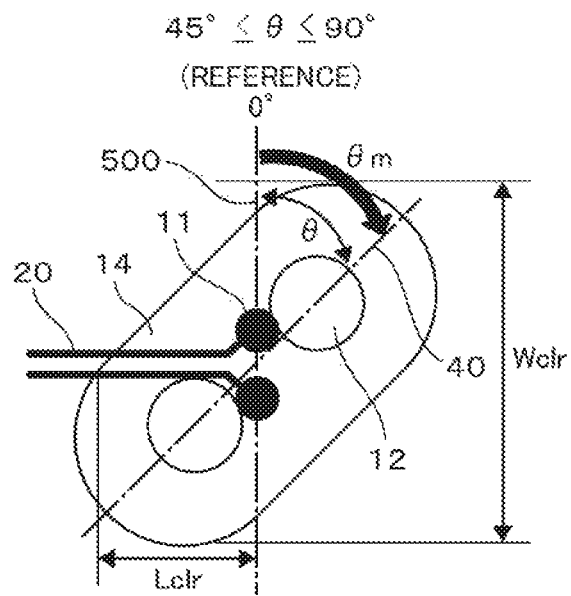
FIG. 6B is a diagram illustrating through-holes and clearances formed in the multilayer wiring board according to a second embodiment.
Figure 7:
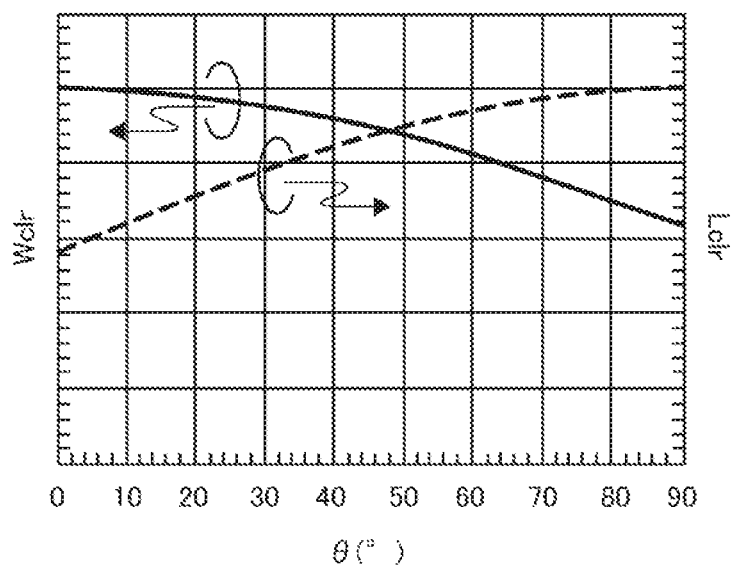
FIG. 7 is a diagram illustrating a relationship between an angle θ between a virtual line 40 and a virtual line 50 and Wclr and Lclr.

Hereinafter, a configuration of a multilayer wiring board according to a second embodiment will be described with reference to FIGS. 6A, 6B, 7, and 8. FIG. 6A is a diagram illustrating through-holes and clearances formed in the multilayer wiring board according to the first embodiment. FIG. 6B is a diagram illustrating through-holes and clearances formed in the multilayer wiring board according to the second embodiment. FIG. 7 illustrates the relationship between the angle θ between the virtual line 40 connecting the differential pair of the through-hole 12 in the core layer 23 and the line perpendicular to the signal propagation direction of the differential wire line, and Wclr and Lclr. In the first embodiment, the configuration where the through-hole pair 12 of the core layer 23 is arranged so that the virtual line 40 connecting the centers of the differential pair of the through-holes 12 of the core layer 23 is parallel to the signal propagation direction has been described. In the second embodiment, the virtual line 40 connecting the centers of the differential pair of the through-holes 12 of the core layer 23 is arranged to be inclined from the state of the first embodiment (refer to FIG. 6A). The multilayer wiring board according to the second embodiment is similar to the multilayer wiring board according to the first embodiment except for the points described above, and thus, the description of the common components will be omitted. This point is also applied to the third embodiment.

In the second embodiment, a degree of inclination of the through-hole pair 12 of the core layer 23 is expressed by an angle θ between the virtual line 40 (hereinafter, simply referred to as the virtual line 40 in the second embodiment) connecting the centers of the differential pair of the through-holes 12 of the core layer 23 and a line (hereinafter, referred to as a reference line 500 in the second embodiment) which is perpendicular to the signal propagation direction of the differential wire line and horizontal to the main surface of the multilayer wiring board. In FIGS. 6A and 6B, a mode where the reference line 500 coincides with the virtual line 50 connecting the centers of the differential pair of the through-holes 11 of the build-up layer 22 will be described as an example.

In the configuration of the first embodiment, the virtual line 40 intersects the above-described reference line 500 at an angle of θ=90° (refer to FIG. 6A). Accordingly, in the configuration illustrated in FIG. 6A, the clearance width (Wclr) of the core layer 23 in the direction where the width of the multilayer wiring board is restricted (in the direction perpendicular to the signal propagation direction) is minimized. On the other hand, in the differential wire line which is the high-speed signal wire line, the adjustment of the impedance of the line is performed by using the GND pattern on the front surface of the core layer 23. Therefore, since the clearance 14 formed in the core layer 23 becomes an impedance-discontinuous point of the line, as the wire line length of the line on the clearance 14 becomes longer, the impedance of the line becomes higher. Therefore, in order to obtain good impedance characteristics, the shorter wire line length (Lclr) of the line wired on the clearance 14 is preferred. In the configuration illustrated in FIG. 6A, since the differential wire line 20 which is a high-speed signal wire line is arranged so as to overlap with the clearance 14 of the core layer 23 by the longest width thereof, a degree of deterioration of the high-speed signal transmission characteristics is increased.

In the multilayer wiring board according to the second embodiment, as illustrated in FIG. 6B, the virtual line 40 is inclined so that the angle θ between the virtual line 40 and the reference line 500 approaches 0° from the state of 90° (refer to FIG. 6A). As a result, the length of the wire line where the differential wire line 20 is wired on the clearance 14 of the core layer 23 is shortened, and thus, the deterioration of the high-speed signal transmission characteristics is suppressed.

FIG. 7 illustrates the relationship between the angle θ between the virtual line 40 and the reference line 500 and the Wclr and the Lclr. In addition, the Wclr is the clearance width in the direction perpendicular to the signal propagation direction, and the Lclr is the wire line length of the high speed signal on the clearance. In FIG. 7, a solid line indicates the Wclr, and a broken line indicates the Lclr.

As illustrated in FIG. 7, as the angle θ between the virtual line 40 and the reference line 500 approaches 90°, the Wclr becomes small, but the Lclr becomes large, and thus, the high-speed signal transmission characteristics are deteriorated. On the other hand, as the angle θ between the virtual line 40 and the reference line 500 approaches 0°, the Lclr becomes small, and thus, the high-speed signal transmission characteristics are improved, but the Wclr becomes large.

As explained above, the Wclr and the Lclr are in a trade-off relationship. Therefore, in the structure in which the through-hole is applied to the restricted board width, it is desirable that the angle θ is 45°≤θ≤90° in order to suppress the deterioration of the high-speed signal transmission characteristics.

As described above, the angle θ is a degree of inclination of the through-hole pair 12 of the core layer 23 expressed by using the angle θ between the virtual line 40 and the reference line 500, and 45°≤θ≤90° includes both a case where the rotation angle $θ_m$ obtained by rotating the virtual line 40 in the clockwise direction in FIG. 6B from the reference line 500 as a starting point is 45°≤$θ_m$≤90° and a case where the rotation angle $θ_m$ is 90°≤$θ_m$≤135°.

In FIG. 6B, a configuration example in the case of 45°≤$θ_m$≤90° is illustrated. The configuration of 90°≤$θ_m$≤135° is the configuration of the through-hole 12 and the clearance 14 arranged to be linearly symmetric with respect to, for example, the arrangement of the through-hole 12 and the clearance 14 illustrated in FIG. 6B around the line parallel to the signal propagation direction and passing through the intersection of the virtual line 40 and the reference line 500. On the other hand, it is preferable that θ is 45° (θ=45°) in order to allow both the Wclr and the Lclr to be equally compatible.

Figure 8:
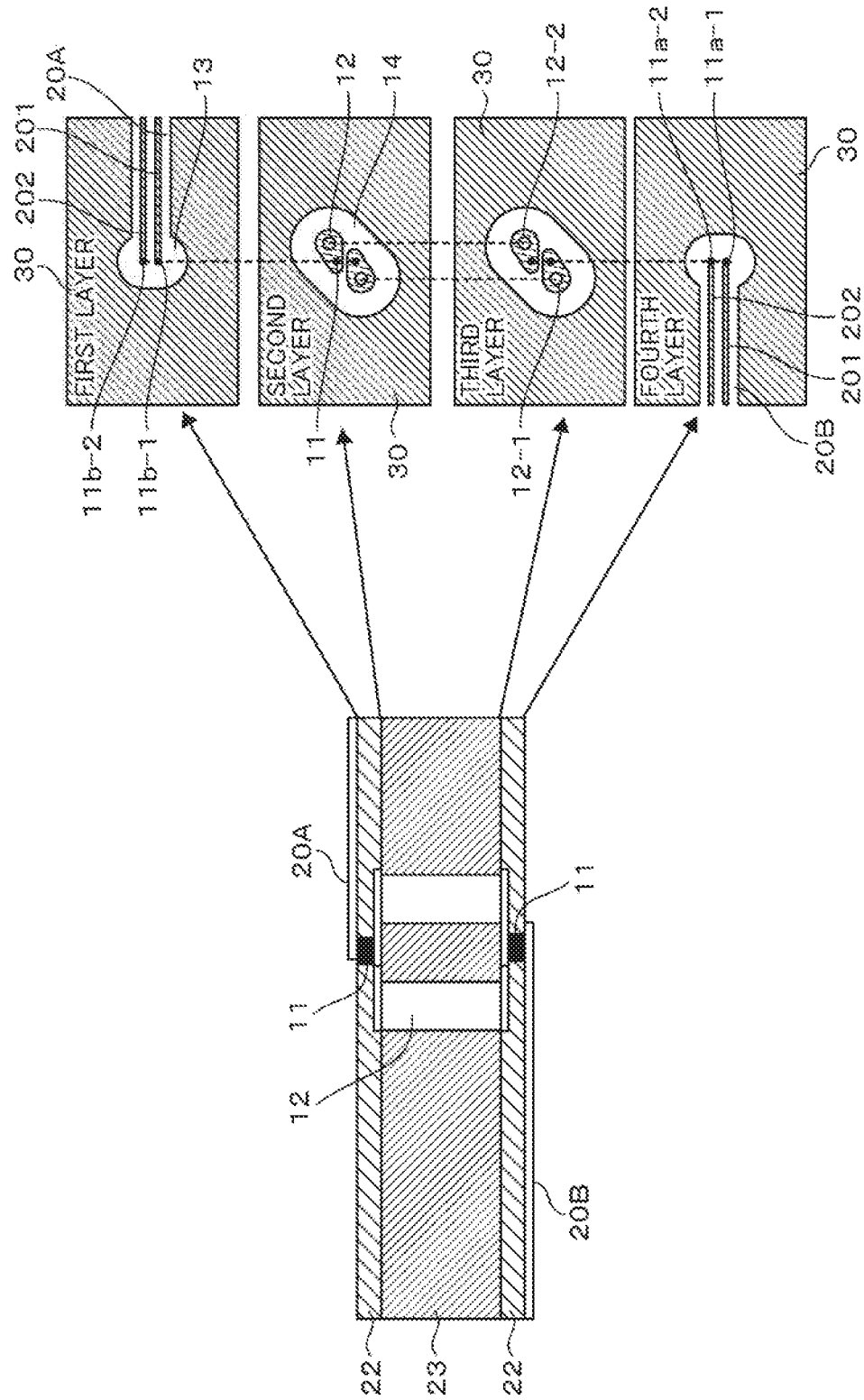
FIG. 8 is a diagram illustrating a wiring pattern of each layer of the multilayer wiring board when through-holes of a core layer are arranged at θ=45°.

FIG. 8 is a diagram illustrating a wiring pattern of each layer of the multilayer wiring board when the through-holes of the core layer are arranged at θ=45°. As illustrated in FIG. 8, the multilayer wiring board according to the second embodiment is configured by laminating a first layer formed by the upper surface of the build-up layer 22, second and third layers formed by the upper surface and the lower surface of the core layer 23, and a fourth layer formed by the lower surface of the build-up layer 22.

Each layer of the multilayer wiring board according to the second embodiment is the same as each layer (refer to FIG. 5) of the multilayer wiring board according to the first embodiment except that the arrangement of the through-holes 12 formed in the second layer and the third layer is different, and thus, the description thereof will be omitted.

Figure 15:
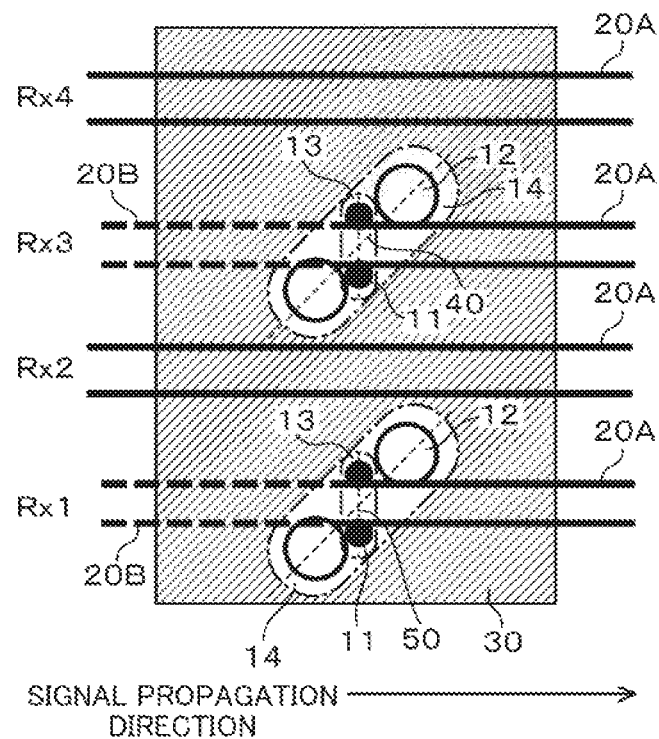
FIG. 15 is a top view of a multilayer wiring board to which the through-hole structure (θ=45°) illustrated in FIG. 6B is applied.

FIG. 15 illustrates a top view of the multilayer wiring board to which the through-hole structure (θ=45°) illustrated in FIG. 6B is applied. In the configuration of FIG. 15, as compared with the configuration of FIG. 14, the length Lclr of the wire line where the differential wire line 20 is wired on the clearance 14 of the core layer 23 is shortened. Therefore, as compared with the configuration illustrated in FIG. 14, the deterioration of the high-speed signal transmission characteristics is suppressed.

Third Embodiment

In the second embodiment, since the virtual line 40 connecting the centers of the differential pair of the through-holes of the core layer 23 is arranged to be inclined from the state of the first embodiment (refer to FIG. 6B), the clearance width (Wclr) of the core layer 23 in the direction perpendicular to the signal propagation direction spreads in the direction where the width of the multilayer wiring board is restricted. Therefore, for example, in the case of θ=45°, the predetermined through-hole 12 and the clearance 14 may not be accommodated in the wiring board region.

In the third embodiment, a configuration where the virtual line 50 connecting the centers of the differential pair of the through-holes 11 of the build-up layer 22 is inclined from the states of the first and second embodiments will be described.

Figure 16:
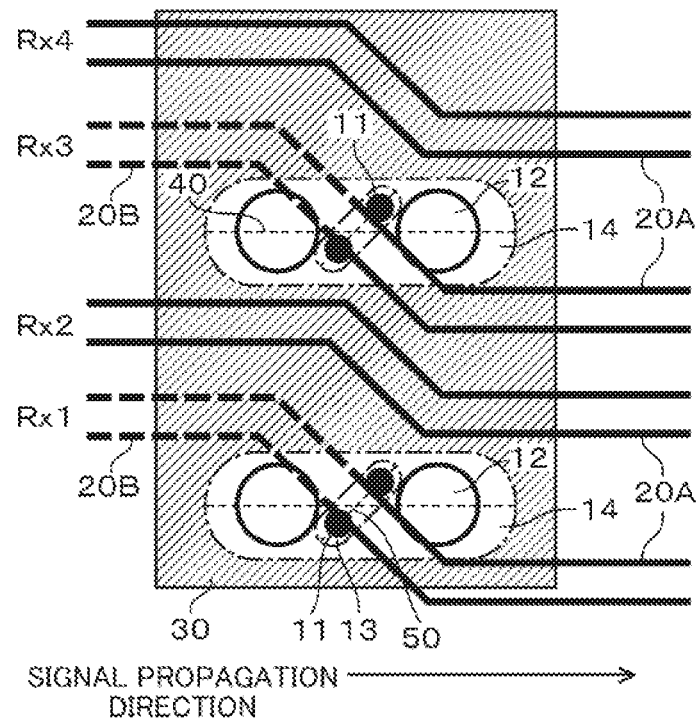
FIG. 16 is a top view of a multilayer wiring board according to a third embodiment.

FIG. 16 illustrates a top view of a multilayer wiring board according to the third embodiment. In the multilayer wiring board according to the third embodiment, the virtual line 40 connecting the centers of the differential pair of the through-holes 12 formed in the core layer 23 is arranged so as to be parallel to the signal propagation direction, and the virtual line 50 connecting the centers of the differential pair of the through-holes 11 of the build-up layer 22 is arranged to be inclined with respect to a line which is perpendicular to the signal propagation direction and horizontal to the main surface of the multilayer wiring board. In the example illustrated in FIG. 16, the angle θ formed between the virtual line 40 and the virtual line 50 is set to 45°.

Thus, in the multilayer wiring board according to the third embodiment, the clearance width (Wclr) in the direction perpendicular to the signal propagation direction in the core layer 23 becomes a narrow width. For this reason, the width of the GMD pattern of Rx2 is secured in the core layer 23, as compared with the configuration of the second embodiment (refer to FIG. 15). In addition, since the differential pair of the through-holes 11 of the build-up layer 22 is arranged to be inclined, the differential wire line 20 is wired to be inclined with respect to the clearance 14 in order to be connected to the through-holes 11. Therefore, as compared with the configuration of the first embodiment (refer to FIG. 14) where the differential wire line 20 overlaps with the clearance 14 of the core layer 23 by the longest width thereof, the wire line length (Lclr) of the line wired on the clearance is shortened.

Fourth Embodiment

Figure 9:
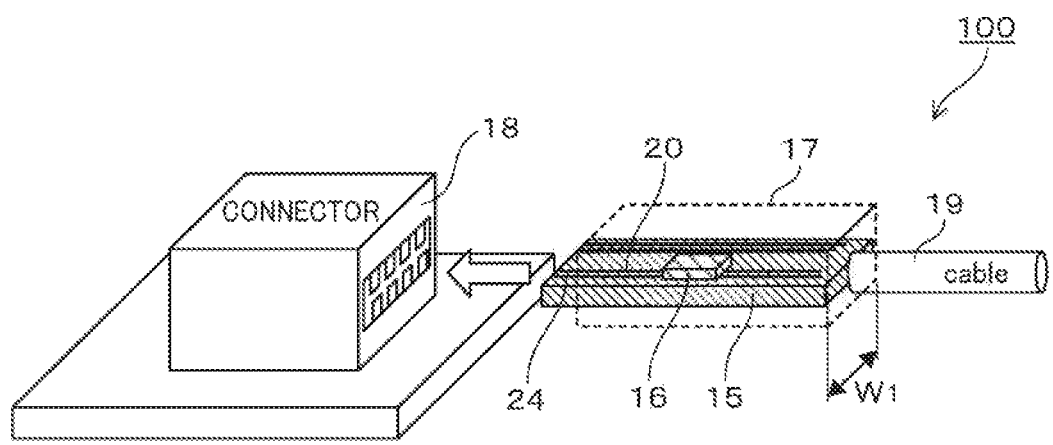
FIG. 9 is a diagram illustrating a configuration of an ACC module 100.

FIG. 9 illustrates a configuration of an ACC module 100. The ACC module 100 includes a cable 19 in which a plurality of differential wire lines 20 are bundled together and QSFP connectors 17 which are differential transmission modules are connected to both ends of the cable 19. Specifically, for example, the cable 19 is formed by bundling a total of eight differential wire lines 20 of four of the differential wire line 20 for transmission and four of the differential wire line 20 for reception, and the QSFP connectors 17 each having a width $W_1$ of about 18 mm are connected to both ends thereof so that bi-directional communication can be performed.

A paddle board 15 is provided inside the QSFP connector 17, and an equalization element 16 having a circuit for compensating for loss caused in the differential wire line 20 is mounted on one surface of the paddle board 15. As the paddle board 15, the multilayer wiring board according to the first embodiment is applied. In addition, the paddle board 15 is not limited to the multilayer wiring board of the first embodiment, and the multilayer wiring board according to the second or third embodiment may be applied.

The cable 19 is connected to one side of the paddle board 15, and a card edge pattern 24 is provided on a side opposite to the side. The card edge pattern 24 is inserted into the card edge connector 18 to connect the QSFP connector 17 and an external device. The cable 19 and the card edge pattern 24 are connected by the differential wire line 20 which is a high-speed signal wire line, and the equalization element 16 is flip-chip-mounted in the middle of the differential wire line 20. In the example illustrated in FIG. 9, the equalization element 16 is mounted in the middle of the reception differential wire line 20. In view of the strength of the QSFP connector 17 and the latch mechanism with the card edge connector 18, in general, the width $W_2$ (refer to FIG. 10) of the paddle board is approximately 14 mm.

As described above, the width $W_1$ illustrated in FIG. 9 is the width of the side of the QSFP connector 17 connected to or opposite to the cable 19, and the width $W_2$ is the width of the side of the paddle board 15 provided, with or opposite to the card edge pattern 24.

In addition, reception is a signal transmission in the direction from the cable 19 toward the external device having the card edge connector 18, and transmission is a signal transmission in the direction from the external device having the card edge connector 18 toward the cable 19.

Figure 10:
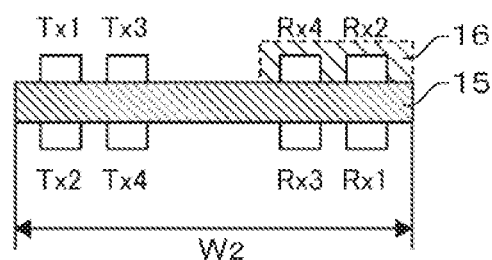
FIG. 10 is a diagram illustrating a layout of high-speed signal pins (high-speed I/O pins) of a QSFP connector 17 illustrated in FIG. 9.

FIG. 10 illustrates a layout, of high-speed signal pins (high-speed I/O pins) of the QSFP connector 17 illustrated in FIG. 9. In the QSFP connector 17, since the signal amplitudes of the Tx side (transmission side) and the Rx side (reception side) are different from each other, crosstalk becomes a problem, and thus, it is necessary to suppress capacitive coupling of high-speed signals and returning of power supply noise. For this reason, as illustrated in FIG. 10, GNDs are separately arranged on the Tx side and the Rx side. In this manner, since the GNDs are separately arranged, in view of the size or the like of the connector, it is difficult, to arrange the high-speed I/O pins only on one-side surface of the paddle board 15. Therefore, as illustrated in FIG. 10, the high-speed I/O pins are arranged on both the front surface sides (Rx2 and Rx4) and the back surface sides (Rx1 and Rx3) of the paddle board 15. In addition, since space is limited on the side of the cable 19, the front surface side (Rx2 and Rx4) and the back surface side (Rx1 and Rx3) have the same pin arrangement as the card edge connector 18.

FIG. 11 illustrates an outline of the chip of the equalization element 16 illustrated in FIG. 9. In the equalization element 16, equalization circuits of four differential wire lines which are high-speed signal wire lines are integrated on one chip. Therefore, for example, when the equalization element 16 is mounted on the front surface of the paddle board 15, there is a need to connect the differential wire line of the pins (Rx1 and Rx3) on the back surface side of the paddle board 15 from the back surface side of the paddle board 15 to the front surface side.

In FIG. 11, reference numeral 161-1 denotes an equalization element of Rx1, reference numeral 161-2 denotes an equalization element of Rx2, reference numeral 161-3 denotes an equalization element of Rx3, and reference numeral 161-4 denotes an equalization element of Rx4. In FIG. 11, reference numeral 162 denotes a power supply pad, reference numeral 163 denotes a GND pad, reference numeral 164 denotes a high-speed signal pad, and reference numeral 165 denotes a control signal pad.

FIG. 12 illustrates a wire line structure of the differential wire line having pins (Rx2 and Rx4) on the front surface side in the ACC module illustrated in FIG. 9. As illustrated in FIG. 12, the signal transmitted through the cable 19 is transmitted to the differential wire lines Rx2 and Rx4 which are the front surface wire line 20A, is input to the equalization element 16 to be shaped in waveform, and then, is transmitted through the front surface wire line 20A to be output to the card edge connector 18.

Figure 13:
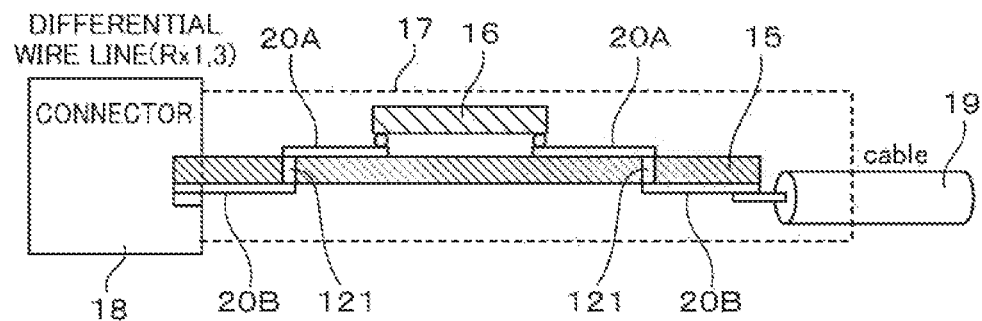
FIG. 13 is a diagram illustrating a wire line structure of a differential wire line having pins (Rx1 and Rx3) on a back surface side in the ACC module illustrated in FIG. 3.

FIG. 13 illustrates a wire line structure of the differential wire line having pins (Rx1 and Rx3) on the back surface side in the ACC module illustrated in FIG. 9. As illustrated in FIG. 13, the signal transmitted through the cable 19 is transmitted to the back surface wire line 20B of the differential wire lines Rx1 and Rx3, and then, is transmitted to the front surface wire line 20A at the through-hole 121. The signal transmitted to the front surface wire line 20A is inputted to the equalization element 16 to be shaped in a waveform, is outputted to the front surface wire line 20A, is transmitted to the back surface wire line 20B again at the through-hole 121, and then, is outputted to the card edge connector 18.

As described above, by using a multilayer wiring board having the through-holes in the inside of the board as the paddle board 15, the transmission loss of the differential wire line Rx1 to Rx4 can be compensated for by the equalization element 16 obtained by integrating wire lines for four lanes into one chip.

For example, as described above, in a case where the width $W_2$ of the paddle board 15 is 14 mm, if the separation arrangement of GND is considered, the wire line width on the Rx side is approximately 6 mm. For example, in the example illustrated in FIG. 14, two pairs of the through-holes and two front surface wire lines are arranged within the width of about 6 mm.

Fifth Embodiment

Figure 17:
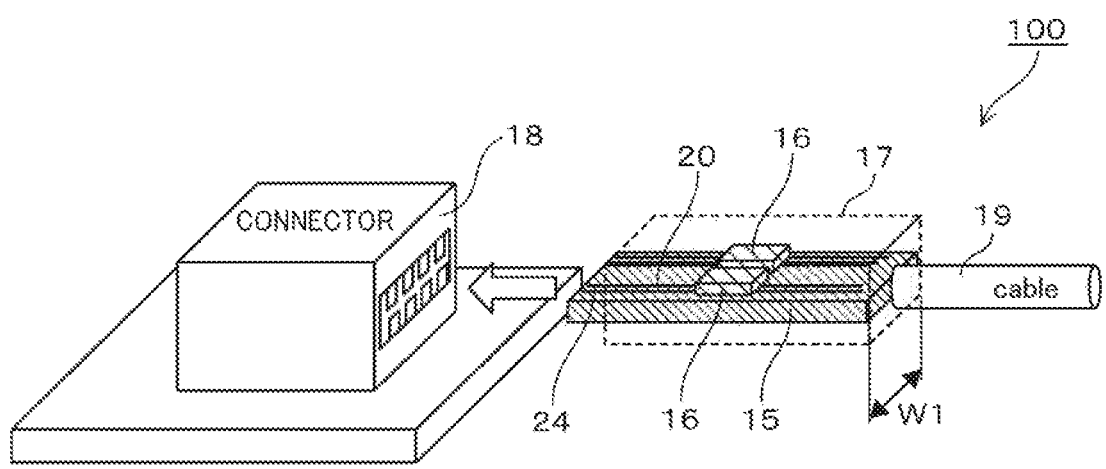
FIG. 17 is a diagram illustrating a configuration of Modified Example of the ACC module 100.

FIG. 17 illustrates a configuration of Modified Example of an ACC module 100. In the ACC module 100 according to the fifth embodiment, a QSFP connector 17 on which an equalization element 16 is mounted is used not only in the wire line path on the reception side but also in the wire line path on the transmission side. In the ACC module 100 illustrated in FIG. 17, the equalization that compensates for transmission loss on both the transmission side and the reception side can be performed by the equalization element 16. In FIG. 17, the equalization element 16 where circuits for performing equalization for four differential wire lines are integrated on one chip is used.

Sixth Embodiment

Figure 18A:
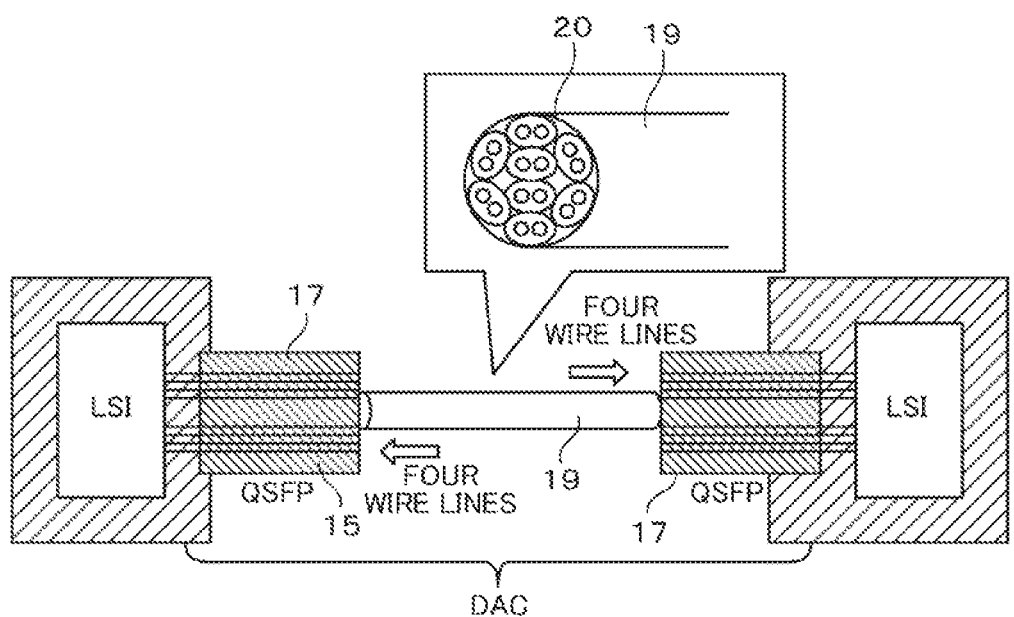
FIG. 18A is a diagram illustrating a configuration of a DAC module.
Figure 18B:
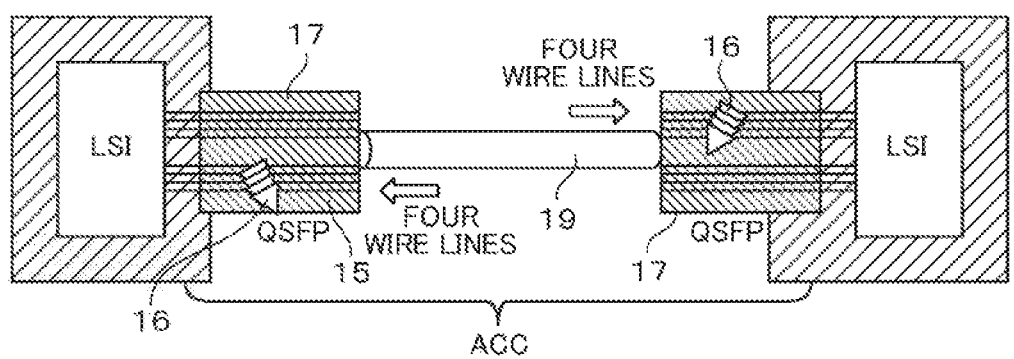
FIG. 18B is a diagram illustrating a configuration of an ACC module.
Figure 19:
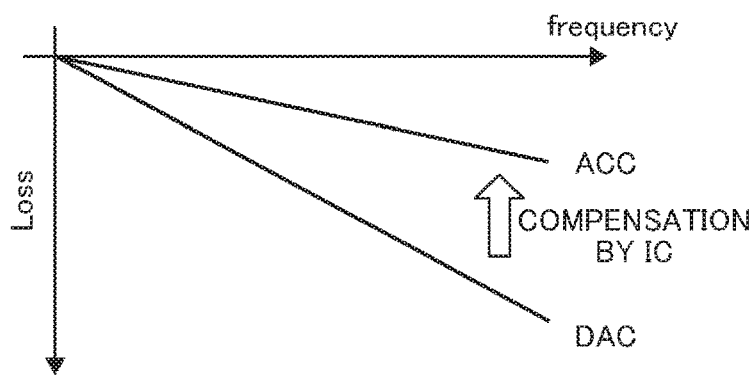
FIG. 19 is a diagram illustrating a comparison result of frequency characteristics of the ACC module and the DAC module at an LSI end.

FIG. 19 illustrates a comparison result of frequency characteristics at the LSI ends of the ACC module and the DAC module. FIG. 18A and FIG. 18B illustrate configurations of the DAC module and the ACC module which are compared in FIG. 19. In addition, FIG. 19 illustrates a result in a case where it is assumed that the cables 19 of the DAC module and the ACC module have the same cable length.

The ACC module illustrated in FIG. 18B includes a cable 19 formed by bundling a plurality of differential wire lines 20 configured with P wire lines and N wire lines and QSFP connectors 17 and 17 provided at both ends of the cable 19. The QSFP connectors 17 and 17 of the ACC module have paddle boards, on which equalization elements 16 are mounted.

A board (not illustrated) is mounted inside the LSI, and a connector receiving the QSFP connectors 17 and 17 is arranged on the board. In the example illustrated in FIG. 18B, a total of eight differential wire lines 20 of four differential wire lines for transmission and four differential wire lines for reception are bundled in the cable 19, so that bidirectional communication is performed, by a combination of these differential wire lines.

FIG. 18A illustrates a basic configuration of the DAC module used for verification in FIG. 19. The DAC module has the same configuration as the ACC module illustrated in FIG. 18B, except that the equalization element 16 is not mounted on the QSFP connectors 17 and 17.

As illustrated in FIG. 19, in the DAC module, a loss reflecting the cable characteristic as it is appears at the LSI end, whereas in the ACC module, a portion of the loss is compensated by the equalization element 16. For this reason, the loss value at the LSI end of the ACC module is smaller than that of the DAC module. Therefore, as an LSI, it is possible to obtain such a characteristic that a cable having a small loss, in other words, a cable having a cable length shorter than an actual length is connected. In addition, in a case where it is assumed that the input conversion noises of the LSI and the equalization element 16 are the same, it is possible to receive a signal amplitude that is larger by the board loss of the LSI on the reception side. For this reason, the ACC is also more advantageous to the signal/noise ratio, which is effective for extending the distance of cable transmission.

As illustrated in FIG. 19, in a case where an LSI is connected by a DAC module, in the LSI, it is necessary to equalize the total loss of the loss of the DAC and the loss of the board mounted on the LSI. For this reason, an equalization circuit capable of compensating for the total loss is required for the LSI. On the other hand, in the ACC module, since the equalization element 16 is mounted in the QSFP connectors, large loss compensation is not required for the LSI side.

As the equalization element 16, for example, an equalization element where an equalization circuit such as a feed forward equalizer (FFE), a continuous time linear equalizer (CTLE), a decision feedback equalizer (DFE), or the like is mounted may be used.

The invention claimed is:

1. A multilayer wiring board having a first layer and a second layer thicker than the first layer laminated with a ground conductor, respectively, and having a differential wire line configured with a first wire line and a second wire line, comprising:
a pair of through-holes which is formed in the first layer and the second layer and electrically connects the first wire line and the second wire line arranged on one surface of the multilayer wiring board and the first wire line and the second wire line arranged on the other surface of the multilayer wiring board, respectively; and a clearance which insulates the ground conductor and the through-holes, wherein the pair of through-holes formed in the second layer is arranged so that a virtual line connecting centers of the pair of through-holes is inclined with respect to a line perpendicular to a signal propagation direction of the differential wire line, and wherein the pair of through-holes formed in the first layer is arranged so that a virtual line connecting the centers of the pair of through-holes is perpendicular to the signal propagation direction of the differential wire line.

2. The multilayer wiring board according to claim 1, wherein the pair of through-holes formed in the second layer is arranged so that the virtual line connecting the centers of the pair of through-holes is in parallel to the signal propagation direction of the differential wire line.

3. The multilayer wiring board according to claim 1, wherein the pair of through-holes formed in the second layer is arranged so that an angle θ between the virtual line connecting the centers of the pair of through-holes and the line perpendicular to the signal propagation direction of the differential wire line satisfies 45°≤θ≤90°.

4. A differential transmission module comprising:

a multilayer wiring board having a first layer and a second layer thicker than the first layer laminated with a ground conductor, respectively, and having a differential wire line configured with a first wire line and a second wire line; and an equalization element mounted on the differential wire line of the multilayer wiring board and having a circuit compensating for loss occurring in the differential wire line, wherein the multilayer wiring board includes:

a pair of through-holes which is formed in the first layer and the second layer and electrically connects the first wire line and the second wire line arranged on one surface of the multilayer wiring board and the first wire line and the second wire line arranged on the other surface of the multilayer wiring board, respectively; and a clearance which insulates the ground conductor and the through-holes, and wherein the pair of through-holes formed in the second layer is arranged so that a virtual line connecting centers of the pair of through-holes is inclined with respect to a line perpendicular to a signal propagation direction of the differential wire line, and wherein the pair of through-holes formed in the first layer is arranged so that a virtual line connecting the centers of the pair of through-holes is perpendicular to the signal propagation direction of the differential wire line.

5. The differential transmission module according to claim 4, wherein the pair of through-holes formed in the second layer is arranged so that the virtual line connecting the centers of the pair of through-holes is in parallel to the signal propagation direction of the differential wire line.

6. The differential transmission module according to claim 4, wherein the pair of through-holes formed in the second layer is arranged so that an angle θ between the virtual line connecting the centers of the pair of through-holes and the line perpendicular to the signal propagation direction of the differential wire line satisfies 45°≤θ≤90°.

* * * * *